Dec. 1, 1964 J. C. WHEELER 3,159,127

FIXTURE FOR PRINTED CIRCUIT BOARDS

Filed Aug. 22, 1961

INVENTOR.
JAMES C. WHEELER
BY
Morse & Altman
ATTORNEYS 3,159,127
Patented Dec. 1, 1964

3,159,127

FIXTURE FOR PRINTED CIRCUIT BOARDS

James C. Wheeler, Topsfield, Mass., assignor to Defiance Printed Circuit Corp., Malden, Mass., a corporation of Massachusetts Filed Aug. 22, 1961, Ser. No. 134,045
7 Claims. (Cl. 113—99)

Figure 1:
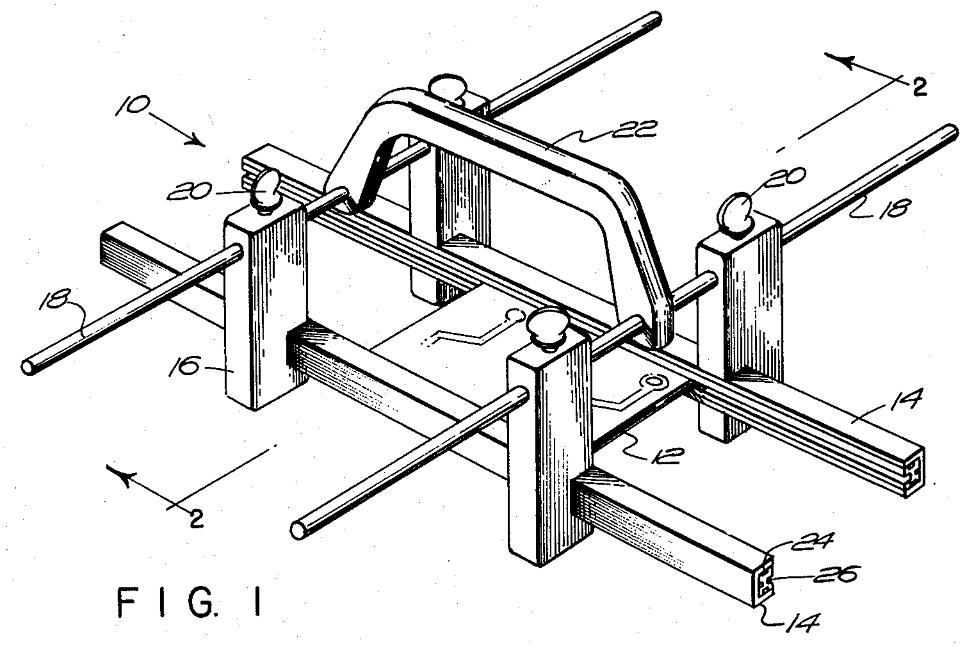

This invention relates in general to printed circuit devices and more particularly concerns a novel fixture for supporting a printed board during a dip soldering operation.

The development of printed circuits has helped to minimize one major cause of unrealiability in electronic equipment by permitting the use of dip soldering processes. In dip soldering, all of the joints between the various electronic components assembled on the circuit board and the printed conductors are exposed to molten solder and joined in a single operation. For mass production requirements the dip soldering may be carried out by automatic machines which draw the board across the top of a fountain of molten solder. Other systems employ small jets of molten solder which are directed only to those spots on the printed circuit where the solder joints are to be made.

For short runs automatic machines are entirely impractical because of the time and effort involved in starting up the machine and adjusting it to the circuit board. Also the high cost of these machines place them out of the reach of a great many producers of printed circuit boards. In practice it has been found that dip soldering of the printed circuit boards may be carried out efficiently by fabricating a bracket conforming to the size of the board, mounting the board to the bracket and then manually dipping the bracket together with its board into the solder bath.

While this measure has proven satisfactory, a rather large assortment of brackets must be maintained in order to accommodate all sizes of circuit boards. Very frequently, where a board of unusual dimensions is to be soldered, a special bracket must be fabricated to insure that the board is properly supported during the dipping process.

Accordingly, it is an object of the present invention to provide an adjustable bracket for supporting printed circuit boards in a wide variety of sizes during dip soldering operations.

Another object of this invention is to provide a printed circuit board fixture which may be readily adjusted not only to accommodate boards of various widths but which also may be adjusted to supported boards of various thicknesses.

More particularly, this invention features a fixture for supporting a printed circuit board, with or without assembled components, in which a pair of oppositely facing parallel channel members, forming part of the fixture frame, may be moved to or away from one another along guide rods. The channel members may be locked in any selected position depending upon the width of the circuit board which is to be supported by the fxture.

Disposed in both of the facing channels and extending the full length thereof are a pair of matched inserts of resilient heat resistant material. Formed lengthwise along each side of each insert is a groove which is adapted to engage the marginal edge of a circuit board mounted between the channel members. The grooves in each insert vary in size to accommodate boards of different thicknesses and the inserts may be readily stripped from their channels, turned so as to expose the proper size groove and pressed back into position.

Figure 2:
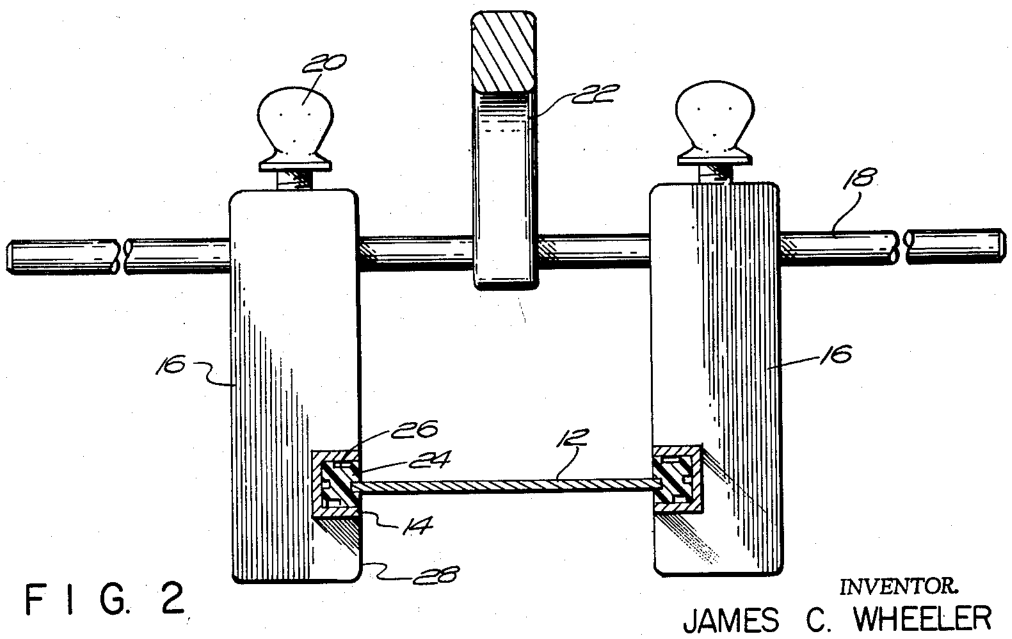

But these and other features of the invention along with further objects and advantages thereof will become more readily apparent from the following detailed description, taken in connection with the accompanying drawing, in which:

FIG. 1 is a view in perspective of an adjustable printed circuit board fixture made according to the invention; and FIG. 2 is a cross-sectional view taken along the line 2—2 of FIG. 1.

Referring now to the drawing, the reference character 10 generally indicates a fixture for supporting one or more printed circuit boards 12. The fixture includes a pair of elongated channel members 14 arranged parallel to one another and each rigidly secured to the lower portion of a pair of blocks 16. A pair of parallel cylindrical rods 18 are arranged normal to the channel members 14 and pass through the upper portions of the block 16. A wing-headed set screw 20 is set into the top of each block 16 for locking the block to the rod. It will, of course, be readily understood that by loosening the screw 20 each pair of blocks may be moved to any position along the rods 18 to adjust the distance between the channel members 14 according to the width of the particular circuit board 12 that is to be mounted between these members.

A handle 22 is provided for the fixture and spans between the two rods 18 with the ends of the handle securely engaging the rods at their mid-portions. Since the fixture will be subjected to at least partial submersion in baths of molten solder it is desirable that the handle be molded or machined from a suitable thermal insulating material. Artificial plastics such as phenolic resins have been found to be satisfactory for this purpose since they may be readily molded, laminated or cast. The plastic produces a stiff, rugged handle that displays a very low coefficient of thermal conduction.

Pressed into each of the channel members 14 is an elongated insert 24, rectangular in cross section and having a groove 26 formed lengthwise along each of the four sides. It will be noted each of the four grooves are substantially the same depth (1/16 inch for example) but vary from one to another in width. Typical grooves widths may range from 3/64 inch to 9/64 inch with intermediate grooves of 7/64 inch and 5/64 inch. These dimensions are only by way of example and may be varied to suit particular needs.

The inserts 24 preferably are fabricated from a heat resistant, resilient material such as silicon rubber or the like. In the illustrated embodiment the insert is 12″ in length and .3125″ in thickness. The channel members 14 likewise are 12″ in length with a channel .2130″ wide. Being slightly thicker than the width of the channel the insert member must be manually pressed into the channel and once seated will remain snugly in place.

In practice, the two inserts are pressed into the channel so that matching grooves will be facing oppositely to one another, as shown. The particular groove size that is exposed will, of course, depend upon the thickness of the circuit board to be mounted, it being intended that the grooves should be selected to fit the marginal edges of the board 12 as closely as possible.

Should it be necessary to change the grooves in order to accommodate a board of greater or lesser thickness than can be conveniently mounted in the exposed grooves, it is necessary merely to strip out the inserts, rotate them to match grooves of the selected size and press the inserts back into their channels.

Normally, the fixture 10 together with one or more circuit boards 12 are dipped into a 60/40 molten tin lead bath of solder which may be at a temperature anywhere between 435° F. and 550° F. At the end of the dip the fixture is removed and struck down against a hard flat surface to knock off excess solder. In order to avoid damaging the board or any components that may be mounted on it, the blocks 16 have been extended down approximately ½" or so from the channel members 14 to form a set of depending legs 28 by which the fixture may be conveniently struck.

Preferably the channel member 14, the block 16, and rods 18 are fabricated from anodized aluminum. The material is easily extruded, light in weight for ease of handling, strong, and will not alloy with the molten solder. Other metals or certain plastic materials may also be used to advantage although care should be taken that the particular material selected does not pick up or react with the solder.

The material employed for the inserts 24 should be somewhat resilient, capable of withstanding high temperatures and should not be affected by the solder. A linear condensation polymer such as silicon rubber is particularly well suited for this purpose. The material is low in cost, extrudable and is capable of remaining flexible over a temperature range of −130° to +600° F. It is characterized by a smooth waxy surface which is completely inert to the molten solder and has the added advantage of permitting easy insertion of a circuit board into the grooves without scratching or otherwise marring the board. Also, silicon rubber posses a coefficient of expansion which is very close to that of aluminum so that the fit between the inserts and the channel members is not altered by the heat of the molten solder.

Other materials may be substituted for the silicon rubber, if desired. A plastic such as Teflon, for example, possesses excellent chemical resistance, good heat stability and withstands the attack of all materials except molten alkali metals. Various other materials will appear to those skilled in the art.

It will be appreciated that the fixture is able to support firmly printed circuit boards up to ⅛" in thickness and up to 12" in width and 16" in length. The fixture may be readily adjusted to accommodate any size circuit board within the above range by merely locking the channel members the proper distance apart and setting the inserts so that the desired grooves are in opposite alignment with one another.

When handling a run of small size circuit boards of the same size, the fixture may accommodate a number of boards at one time. Also the fixture is convenient for supporting boards during operations other than dip soldering. By adjusting the fixture so that the boards are rigidly mounted along their edges there is no possibility of boards warping or becoming otherwise deformed by immersion in the molten solder.

While the invention has been described with particular reference to the illustrated embodiment it will be understood that numerous modifications may be made without departing from the invention.

Having thus described my invention, what I claim and desire to obtain by Letters Patent of the United States is:

1. A portable hand fixture for supporting substantially flat and generally rectangular printed circuit boards of various lengths, widths and thicknesses during dip soldering operations, comprising a pair of elongated rods, a thermal insulating handle mounted to both of said rods and supporting them in spaced parallel relation to one another, a pair of blocks slidably mounted on each of said rods, means for locking each of said blocks in a selected position along said rods, a pair of elongated members arranged parallel to one another and disposed in spaced perpendicular relation to said rods, each of said members being rigidly mounted to one of each pair of said blocks and movable therewith to accommodate circuit boards of various widths, each of said members being formed with an elongated channel with both channels being in registered opposition to one another, a pair of matching elongated resilient insert members removably mounted in said channels and coextensive therewith, each of said insert members being formed with a longitudinal groove along each long side thereof for receiving opposing marginal edges of a circuit board inserted therebetween, said insert members being mountable in various lengthwise positions within said channels to expose any selected groove, each of said grooves being of substantially constant depth but of different widths whereby said insert members may be assembled in said channels with oppositely facing matched grooves to accommodate circuit boards of various thicknesses.

2. A fixture according to claim 1 wherein at least said elongated members and said insert members are fabricated from material that is inert to molten solder.

3. A fixture according to claim 1 wherein said elongated members and said blocks are fabricated from anodized aluminum and said insert members are fabricated from silica rubber.

4. A portable hand fixture for supporting substantially flat and generally rectangular printed circuit boards of various widths, lengths and thicknesses during dip soldering operations, comprising track means, blocks slidably mounted on said track means, locking means for securing each of said blocks in a selected position along said track means, a pair of parallel elongated board supporting members rigidly mounted to said blocks and movable therewith to accommodate circuit boards of various widths, said members being formed with elongated channels in registered opposition to one another, a pair of matching elongated resilient insert members removably mounted in said channels and generally coextensive therewith, each of said insert members being formed with a longitudinal groove along each long side thereof for receiving the marginal edges of a circuit board inserted therein, said insert members being mountable in various positions within said channels to expose any selected groove, each of said grooves being of substantially constant depth but of different widths whereby said insert members may be assembled in said channels with oppositely facing matched grooves of selected widths to accommodate circuit boards of various thicknesses.

5. A portable hand fixture for supporting substantially flat and generally rectangular printed circuit boards of various lengths, widths and thicknesses during dip soldering operations, comprising linear guide means, blocks slidably mounted on said guide means, means for locking each of said blocks in a selected position along said guide means, a pair of elongated board supporting members arranged parallel to one another and adapted to support opposite marginal edges of a board inserted therebetween, each of said members being rigidly mounted to said blocks and movable therewith whereby circuit boards of various widths may be accommodated, each of said members being formed with an elongated channel with both channels being in registered opposition to one another, matching multi-sided resilient insert members removably mounted in each of said channels, each of said insert members being formed with a groove along each side thereof and mountable in various longitudinal positions to expose any selected groove, the grooves of each member being of different widths whereby said insert members may be oriented with oppositely facing matched grooves to accommodate circuit boards of various thicknesses.

6. A fixture according to claim 5 wherein said blocks extend below said board supporting members to form a set of depending legs for said fixture.

7. A portable hand fixture for supporting substantially flat and generally rectangular printed circuit boards of various lengths, widths and thicknesses during dip soldering operations, comprising a pair of elongated members arranged parallel to one another, means supporting said members for movement to and away from each other to accommodate circuit boards of various widths and lengths, means for locking said members in a selected position spaced from one another, each of said members being formed with an elongated channel with both channels being in registered opposition to one another, a pair of matching resilient insert members removably mounted in said channels, each of said insert members being formed with a groove along each side thereof, said grooves being each of a different width and each corresponding to the thickness of boards to be received in the fixture, said insert members being mountable in various positions to expose any selected groove whereby said insert members may be assembled with oppositely facing matched grooves to accommodate circuit boards of any selected thickness within a range limited by the widths of said grooves and a handle connecting said fixture for grasping same.

References Cited in the file of this patent

UNITED STATES PATENTS

| | | |
|---|---|---|
| 2,964,007 | Buffington | Dec. 13, 1960 |
| 3,000,342 | Dorosz et al. | Sept. 19, 1961 |
| 3,058,440 | Berry | Oct. 16, 1962 |

FOREIGN PATENTS

| | | |
|---|---|---|
| 525,321 | Belgium | Jan. 15, 1954 |

OTHER REFERENCES

Rubber Age, volume 58, No. 5, February, 1946, pages 579 to 584 relied on.